(12) United States Patent
Kang et al.

(10) Patent No.: US 7,002,822 B2
(45) Date of Patent: Feb. 21, 2006

(54) CONTENT ADDRESSABLE MEMORY DEVICE

(75) Inventors: Tae-gyoung Kang, Yongin (KR); Uk-rae Cho, Suwon (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 148 days.

(21) Appl. No.: 10/644,145

(22) Filed: Aug. 20, 2003

(65) Prior Publication Data

US 2005/0024976 A1 Feb. 3, 2005

(30) Foreign Application Priority Data

Apr. 25, 2003 (KR) ............. 10-2003-0026427

(51) Int. Cl.
*G11C 15/00* (2006.01)

(52) U.S. Cl. .................. 365/49; 365/200; 365/203
(58) Field of Classification Search .......... 365/49, 365/200, 185.23, 185.26, 203, 191, 204, 365/230.06

See application file for complete search history.

(56) References Cited

U.S. PATENT DOCUMENTS

| | | | |
|---|---|---|---|
| 5,319,590 A | 6/1994 | Montoye | |
| 5,949,696 A | 9/1999 | Threewitt | |
| 6,320,777 B1 | 11/2001 | Lines et al. | |
| 6,411,538 B1 | 6/2002 | Kengeri | |
| 6,445,628 B1 | 9/2002 | Pereira et al. | |
| 6,496,399 B1 | 12/2002 | Choi et al. | |
| 6,522,562 B1 | 2/2003 | Foss | |
| 6,845,025 B1 * | 1/2005 | Nataraj | 365/49 |
| 6,888,730 B1 * | 5/2005 | Foss et al. | 365/49 |
| 2002/0015348 A1 | 2/2002 | Gillingham et al. | |
| 2002/0067632 A1 * | 6/2002 | Batson et al. | 365/49 |
| 2003/0081442 A1 * | 5/2003 | Tsuda et al. | 365/49 |
| 2003/0206466 A1 * | 11/2003 | Aikawa | 365/200 |
| 2004/0022098 A1 * | 2/2004 | Hatanaka et al. | 365/200 |
| 2004/0213027 A1 * | 10/2004 | Liu et al. | 365/49 |

FOREIGN PATENT DOCUMENTS

JP 2002-260389 9/2002

* cited by examiner

*Primary Examiner*—Richard Elms
*Assistant Examiner*—Dang T. Nguyen
(74) *Attorney, Agent, or Firm*—F.Chau & Associates,LLC

(57) ABSTRACT

A ternary content addressable memory (TCAM) device comprising a plurality of TCAM cells for storing data, each TCAM cell having two memory cells and a comparison circuit for comparing between data stored in the memory cells and data input on a search line pair connected to the comparison circuit, wherein the comparison circuit comprises a first plurality of MOS transistors connected between a match line and a second plurality of MOS transistors, the second plurality of MOS transistors being connected to ground, wherein the first plurality of MOS transistors are gated by signals from the memory cells connected thereto and the second plurality of transistors are gated by signals from a search line pair. The TCAM device includes redundant memory cells which replaces by corresponding column memory cells determined to be defective. Each line of a search line pair is connected to a defective cell is discharged to ground.

30 Claims, 11 Drawing Sheets

US 7,002,822 B2

CONTENT ADDRESSABLE MEMORY DEVICE

BACKGROUND OF THE INVENTION

This application claims priority to Korean Patent Application No. 2003-26427, filed on Apr. 25, 2003.

1. Field of the Invention

The present invention relates to a content addressable memory cell; particularly, a content addressable memory device having redundant array for replacing a defective cell and a ternary content addressable memory capable of storing three states of information.

2. Discussion of Related Art

Semiconductor memories include RAMs, ROMs, and content addressable memories (hereafter referred to as "CAMs"). While RAMs and ROMs use addresses to indicate specific cells within the memory cell array to access data therein, CAMs receive data instead of addresses. The data input to the CAM is compared with data stored in all the cells simultaneously, and the matched result is the address. The CAM is commonly used in applications requiring fast searches for a pattern, a list, image data, etc.

Binary CAM cell and ternary CAM (TCAM) cell are different types of CAMs. A typical binary CAM cell is configured like a RAM cell to store one of two states of information, i.e., a logic "1" state and a logic "0" state. The binary CAM cell includes a compare circuit that compares externally supplied data (hereinafter, 'search data') with data stored in the RAM cell and drives a corresponding match line to a predetermined state when the search data and the stored data are matched. Examples of the binary CAM cells are disclosed in U.S. Pat. No. 4,646,271, U.S. Pat. No. 4,780,845, U.S. Pat. No. 5,490,102, and U.S. Pat. No. 5,495,382. A TCAM cell can store one of three states of information, i.e., a logic "1" state, a logic "0" state, and a "don't care" state. An example of the ternary CAM cell is disclosed in U.S. Pat. No. 5,319,590.

FIG. 1 shows a conventional TCAM cell. To perform a write operation, data to be stored in the CAM cell is loaded onto bit line pairs BL1, /BL1, and BL2, /BL2. The word line WL is asserted active logic '1' turning on n-channel access transistors Q1, Q2, Q3 and Q4. The data carried on the complementary bit line pairs is thereby written into the two SRAM cells and the word line is de-asserted.

For a read operation, the word line is asserted an active logic '1' and the data from the SRAM cells is read onto the bit line pairs. The data then is transferred to data buses (not shown).

For a search and compare operation, the match line is pre-charged to a logic '1' and the search data is placed on the search line pair SL1 and /SL1. Typically, search data and stored data are provided in such a manner that if there is a mismatch a change occurs in the match line state. The match line ML is pre-charged to a logic '1' and a mismatch discharges the match line to ground, whereas in the case of a match no change occurs in the state of the match line.

If the CAM cell MC11-1 stores a logic '1' in the left SRAM cell and a logic '0' in the right SRAM cell, and SL1 has a logic '1', and /SL1 has a logic '0', a mismatch will result. The output of the left SRAM cell provides a logic '1' to a transistor Q6 and turning it on. The search line SL1 provides a logic '1' to a transistor Q5 and turning it on. Since Q5 and Q6 are both turned on, they provide a path to discharge the match line ML to ground and thus indicate a mismatch.

If the CAM cell stores a logic '0' in the left SRAM cell and a logic '1' in the right SRAM cell, a match condition will result. The output of the left SRAM cell provides a logic '0' to the gate of transistor Q6 and leaving it turned off. The search line SL1 provides a logic '1' to the gate of transistor Q5 and turning it on. Since Q5 and Q6 are serially connected, a path to ground does not exist for discharging the match line ML to ground. Similarly, the right SRAM cell provides a logic '1' to the transistor Q8 and turning it on. The search line /SL1 provides a logic '0' to the transistor Q7 and leaving it turned off. Therefore, similarly to the left SRAM cell, transistors Q7 and Q8 do not provide a path to discharge the match line ML to ground. As a result, the match line remains pre-charged to a logic '1', indicating a match condition.

If the CAM cell stores a logic '0' in both the right and left SRAM cells, a "don't care" state exists. The output from each SRAM cell produces a logic '0'. The logic '0' is provided to the gate of transistors Q6 and Q8, ensuring that a don't care condition is detected regardless of the data provided on the search line pair SL1 and /SL1, and the match line remains unchanged.

Although TCAMs provide advantages such as speedy access for numerous applications, there are performance and reliability issues which can be inproved upon. For example, if the match line is pre-charged to a logic '1' and the CAM cell stores a logic '0' in the right SRAM cell and the search line /SL1 provides a logic '1, then the voltage level of the match line ML fluctuates. This is because the voltage level floats between the transistor Q7 and the transistor Q8.

In addition, a CAM is rendered inoperable or unusable when there are defective cells. For example, a cell may become defective during the manufacturing process or operation of the CAM. To increase manufacturing yield, other memories such as SRAM and DRAM have provided redundant memory arrays to replace the defective memory cells. When memory cells in an array are defective or become defective, a redundant memory array replaces the array with the defective cell and the data is accessed to and from the redundant memory array. Fuses are generally provided in memories having redundant arrays to switch the arrays into the memory device. When replacement is needed, the fuses for the defective rows are then blown to disable the defective rows, thereby preventing access to the defective rows. An example of a redundancy scheme in a CAM is disclosed in U.S. Pat. No. 6,445,628.

In view of the foregoing, a need exists for a CAM circuit and method capable of stable and redundant operations.

SUMMARY OF THE INVENTION

A ternary content addressable memory (TCAM) device is provided, comprising: a plurality of TCAM cells for storing data, each TCAM cell having two memory cells and a comparison circuit for comparing data stored in the memory cells with data input on a search line pair connected to the comparison circuit, wherein the comparison circuit comprises first, second, third, and forth NMOS transistors, the first and second NMOS transistors having their drains connected to a match line, their gates connected to the memory cells and their source connected to drains of the third and forth NMOS transistors, and the third and forth NMOS transistors having their gates connected to the search line pair and their source connected to ground.

Preferably, the comparison circuit discharges the match line upon a mismatch between data stored in the memory cells and data input on the search line pair connected to the comparison circuit. A precharge circuit connected to the search line pair for discharging each line of the search line pair to ground upon determination that at least one of the memory cells connected thereto are defective, wherein the precharge circuit comprises two NMOS transistors, each having its gate connected to a power supply node, its source connected to ground and its drain connected to a corresponding one of the search line pair. Further, the two NMOS transistors of the precharge circuit are sized to present a low level, it the search line pair when no signal is present at the search line pair and to present the same level as a signal asserted at the search line pair.

A repair signal generator is also provided for generating signals indicating which of the memory cells are defective, and a switching circuit for switching at least a plurality of connections of TCAM cells determined to be defective to corresponding connections of redundant TCAM cells, wherein the redundant TCAM cells form at least one column of TCAM cell arrays.

The memory cells of the TCAM device of the present invention are SRAM cells or DRAM cells, etc.

According to another embodiment of the present invention, a ternary content addressable memory (TCAM) device is provided which comprises a plurality of TCAM cells for storing data, each TCAM cell having two memory cells and a comparison circuit for comparing between data stored in the memory cells and data input on a search line pair connected to the comparison circuit, wherein the comparison circuit comprises a first plurality of MOS transistors connected between a match line and a second plurality of MOS transistors, the second plurality of MOS transistors being connected to ground, wherein the first plurality of MOS transistors are gated by signals from the MEMORY cells connected thereto and the second plurality of transistors are gated by signals from a search line pair; a repair signal generator for generating signals indicating which of the memory cells are defective; and a precharge circuit connected to the repair signal generator and the search line pair for discharging each of the search line pair to ground upon receipt of signal from the repair signal generator indicating that the memory cells connected thereto are defective.

Preferably, the comparison circuit comprises a first plurality of MOS transistors connected between a match line and a second plurality of MOS transistors, the second plurality of MOS transistors being connected to ground, wherein the first plurality of MOS transistors are gated by signals from the MEMORY cells connected thereto and the second plurality of transistors are gated by signals from a search line pair. Further, the first and second plurality of MOS transistors are N type and are configured to connect the match line to ground upon a mismatch of the data in the corresponding MEMORY cells with the data present at the corresponding search line pair.

According to still another embodiment of the present invention, a ternary content addressable memory (TCAM) device comprises a plurality of TCAM cells for storing data, each TCAM cell having two memory cells and a comparison circuit for comparing between data stored in the memory cells and data input on a search line pair connected to the comparison circuit, wherein the comparison circuit comprises a first plurality of MOS transistors connected between a match line and a second plurality of MOS transistors, the second plurality of MOS transistors being connected to ground, wherein the first plurality of MOS transistors are gated by signals from the memory cells connected thereto and the second plurality of transistors are gated by signals from a search line pair, wherein the first and second plurality of MOS transistors are N type and are configured to connect the match line to ground upon a mismatch of the data in the corresponding MEMORY cells with the data present at the corresponding search line pair.

The TCAM device according to this embodiment further includes a main search line driver for driving data signals to a plurality of search line pairs and at least one redundant search line driver for replacing the main search line driver upon determination that at least one of the memory cells connected to a corresponding search line pair are defective; a repair signal generator for generating signals indicating which of the memory cells are defective; redundant TCAM cells and a switching circuit for switching at least a plurality of connections of TCAM cells determined to be defective to the redundant TCAM cells, wherein the switching circuit outputs signals for switching connections of a column of TCAM cells having defective cells with corresponding connections of a column of redundant TCAM cells.

A method of a ternary content addressable memory (TCAM) device is also provided, which comprises a plurality of TCAM cells for storing data, each TCAM cell having two memory cells and a comparison circuit for comparing between data stored in the memory cells and data input on a search line pair connected to the comparison circuit, wherein the comparison circuit comprises a first plurality of MOS transistors connected between a match line and a second plurality of MOS transistors, the second plurality of MOS transistors being connected to ground, wherein the first plurality of MOS transistors are gated by signals from the memory cells connected thereto and the second plurality of transistors are gated by signals from a search line pair.

BRIEF DESCRIPTION OF THE DRAWINGS

The accompanying drawings form a part of the specification and are to be read in conjunction therewith and in which like reference numerals are used to indicate like parts in various views and embodiments.

DETAILED DESCRIPTION OF PREFERRED EMBODIMENTS

Figure 1:
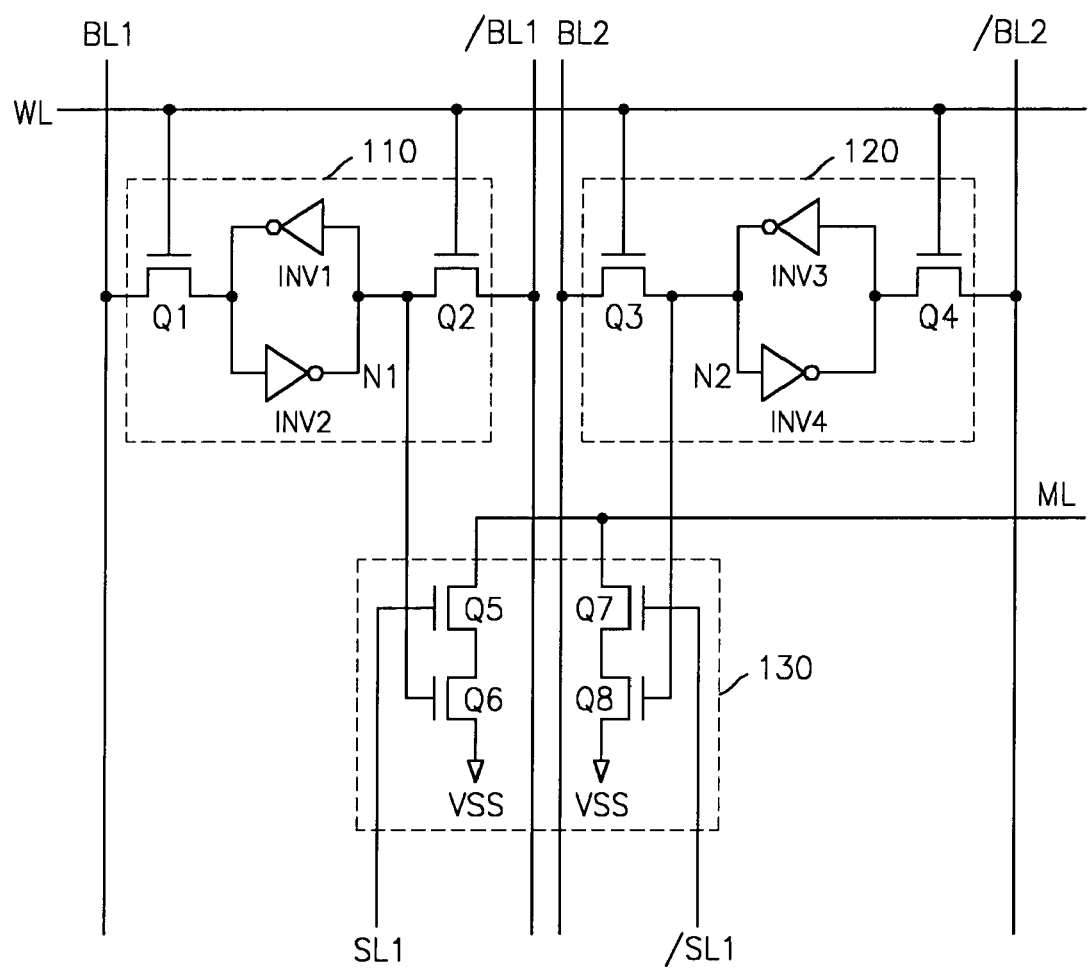
FIG. 1 is a circuit diagram of a conventional TCAM cell.
Figure 2:
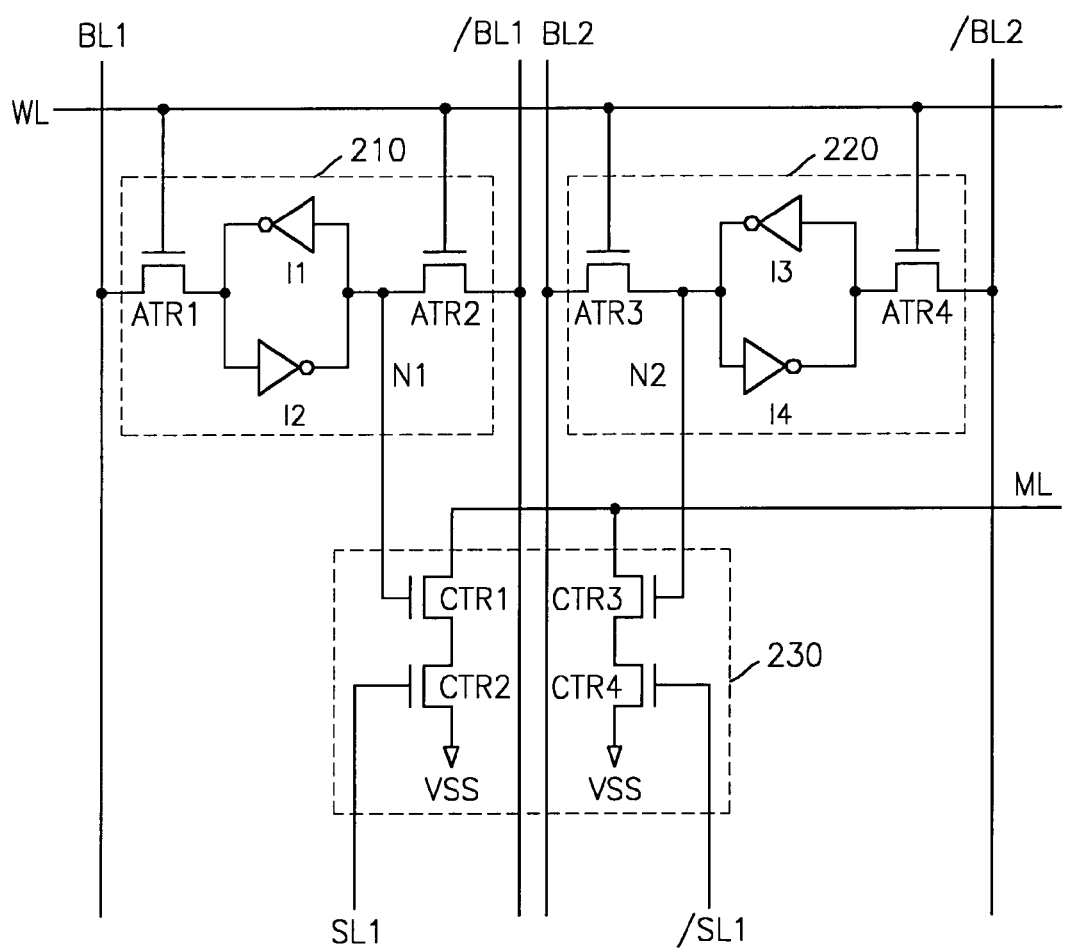
FIG. 2 is a circuit diagram of a TCAM cell in accordance with an embodiment of the present invention.

FIG. 2 shows a TCAM cell according to a preferred embodiment of the present invention. The TCAM cell MC11 includes two SRAM cells and a comparison circuit. Each SRAM cell includes two inverters (INV1, INV2 or INV3, INV4) and two access transistors (Q1, Q2 or Q3, Q4). A comparison circuit includes transistors Q5 to Q8. The drains of the transistors Q5 and Q7 are connected to a match line ML. The gates of the transistors Q5 and Q7 are connected to the SRAM cells, respectively. The sources of the transistors Q5 and Q7 are connected to the drains of the transistors Q6 and Q8 respectively. The gates of the transistors Q6 and Q8 are connected to the search line pair SL1 and /SL1 respectively. The sources of the transistors Q6 and Q8 are connected to a common ground. Different from the conventional TCAM cell as shown in FIG. 1, the gates of the transistors Q6 and Q8 are connected to search line pair SL1 and /SL1, respectively, and the gates of the transistors Q5 and Q7 are connected to the SRAM cells, respectively. According to the configuration of the TCAM cell of this embodiment, there is no floating voltage at the connection between transistors Q5 and Q6 (or Q7 and Q8). As an example, when match line ML is precharged at logic '1', search line (SL1) provides a logic '1', and the left SRAM cell provides a logic '0' at node N1, and the right SRAM cell provides logic '1' at node N2, there is no floating voltage at the connection between transistors Q7 and Q8. Thus the voltage level of the match line ML does not fluctuate.

Figure 3:
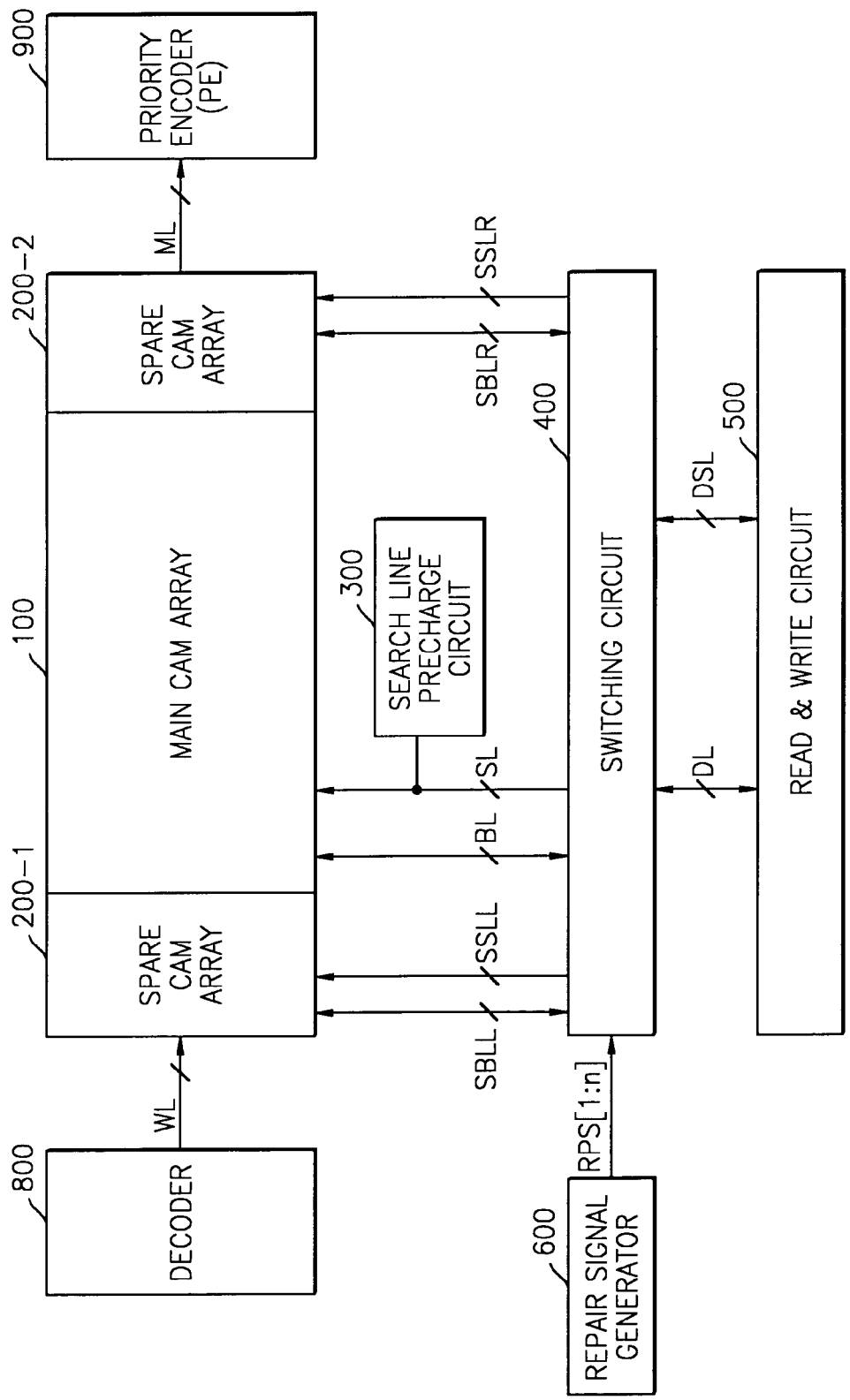
FIG. 3 is a block diagram of a CAM device according to another embodiment the present invention.

FIG. 3 shows a block diagram of a CAM 10 in accordance with another second embodiment of the present invention. According to this embodiment, CAM 10 is configured to replace defective CAM cells in the main CAM array with redundant CAM cells. Further, search line pairs of defective cells are discharged to ground. CAM 10 of FIG. 3 includes a main CAM array 100, spare CAM arrays 200-1 and 200-2, a search line pre-charge circuit 300, a switching circuit 400, a read & write circuit 500, a repair signal generator 600, a decoder 800 and a priority encoder 900. The main CAM array 100 has a plurality of main CAM cells. Spare CAM arrays 200-1 and 200-2 have a plurality of spare CAM cells. The switching circuit 400 receives repair signals RPS[1:n] from the repair signal generator 600 and switches the connections of bit line pairs and search line pairs from a defective memory cell to corresponding connections of a spare memory cell. The search line pre-charge circuit 300 discharges the search line pair to ground when the corresponding search line pair is coupled to a defective CAM cell. The read & write circuit 500 includes sense amplifiers and data input buffers and data output buffers, etc. (not shown). The repair signal generator 600 includes fuses, which may be electrical or laser programmable fuses and stores repair information and outputs repair signals RPS[1:n] to the switching circuit 400. The decoder 800 selectively drives the word lines WL based on an operation mode instruction from a memory controller (not shown). For example, the decoder 800 selectively drives one of the word lines WL when storing data information in TCAM cells of any row or when reading out data information therefrom. The priority encoder 900 generates an address corresponding to currently inputted search data in response to logic states of the match lines ML.

Figure 4:
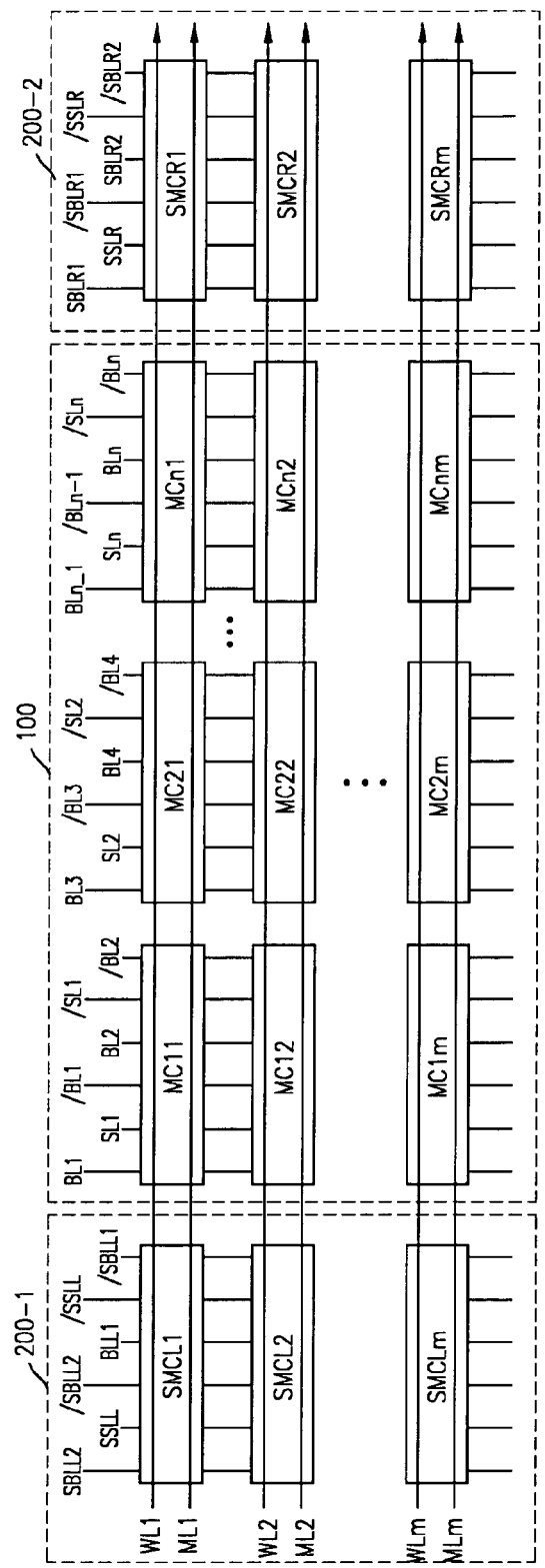
FIG. 4 illustrates a detailed block diagram of the CAM array of FIG. 3.

FIG. 4 illustrates a more detailed block diagram of the main CAM array 100 and spare CAM arrays 200-1 and 200-2 in FIG. 3. Referring to FIG. 4, the main CAM array 100 comprises a plurality of CAM cells arranged in a matrix of rows and columns. Each CAM cell is connected to bit line pairs (for example, BL1 to /BL2 in the case of MC1m) and to a search line pair (for example, SL1 and /SL1 in the case of MC1m). The detailed circuit of each CAM cell in CAM array 100 is shown in FIG. 2. Spare CAM arrays 200-1 and 200-2 comprise a plurality of CAM cells arranged in a matrix of rows and column. Each spare CAM cell is connected to spare bit line pairs (for example, SBLL1 to /SBLL2 in the case of SMCL1) and to a search line pair (for example, SSLL and /SSLL in the case of SMCL1).

Figure 6:
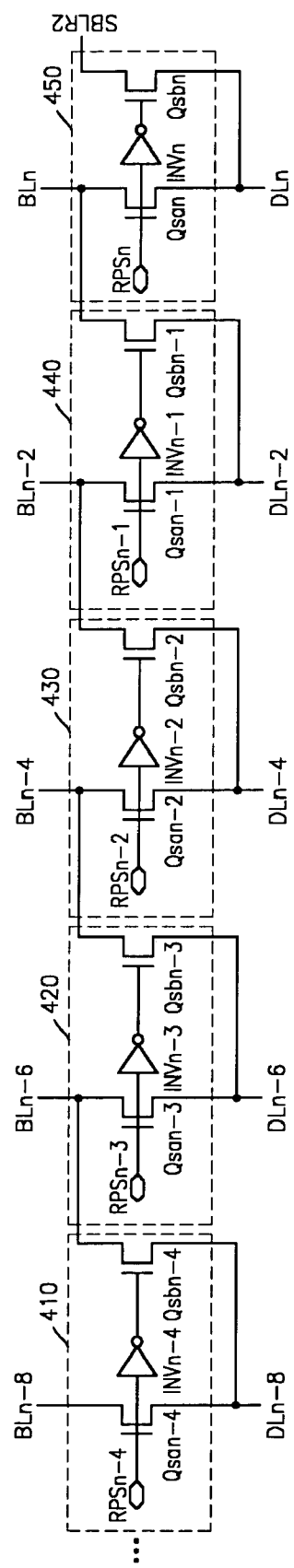
FIG. 6 is a circuit diagram of the switching circuit of FIG. 3.

FIG. 6 shows a circuit diagram of a switching circuit 400 in FIG. 3. Referring to FIG. 6, a switching circuit 400 comprises a plurality of n-type MOS transistors and a plurality of inverters for receiving switching signals RPS [1:n] from the repair signal generator 600. Search lines (for example, SSLR, SLn, etc.) and some of bit lines (for example, SBLR1, BLn-1, etc.) are not shown.

The operation of FIG. 3 to replace a defective column in the main CAM array 100 with a spare column in the spare CAM array 200-1, 200-2 is explained with an example. Assume that MCn2 in the main CAM array 100 of FIG. 4 has been determined to be defective. The repair signal generator 600 provides RPS[1:n] signals to the switching circuit 400. In this case, one signal RPSn has a logic low state and the other signals RPS1 to RPSn-1 have a logic high state (see FIG. 6). Thus, transistors which receive the RPS [1:n-1] signals Qsa1 to Qsan-1 and Qsbn are turned on and transistors which receive the outputs of inverters INV Qsb1 to Qsbn-1 and Qsan are turned off. According to this switching configuration, CAM cells MC12 to MC(n-1)2 remain connected as before via active transistors QS1 to QS(n-1). The defective cell Mcn2 is switched off by inactive transistor Qsn. The redundant cell SMCR2 is switched in place of defective MCn2 by active transistor Qsbn (connecting SBLR2 to DLn).

Figure 5:
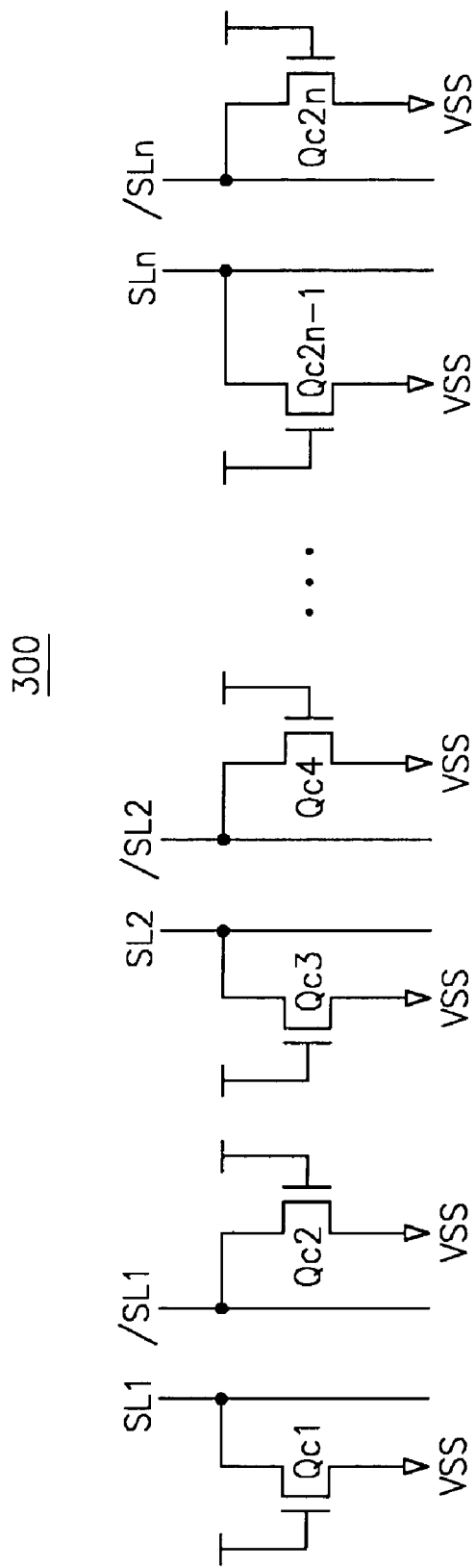
FIG. 5 is a circuit diagram of the search line pre-charge circuit of FIG. 3.

FIG. 5 shows a circuit diagram of a search line pre-charge circuit 300 of FIG. 3. Referring to FIG. 5, a search line pre-charge circuit 300 comprises a plurality of n-type MOS transistors Qc1 to Qc2n. Each n-type MOS transistor Qc1 to Qc2n has a gate that is connected to Vdd and a source that is connected to ground and a drain that is connected to the corresponding search line. The search line pre-charge circuit 300 discharges the search line pair to ground when the corresponding search line pair is coupled to a defective CAM cell. Transistors Qc1 to Qc2n in FIG. 5 are made small in size so that in the event a defective column in the main CAM array 100 is replaced with a spare column in the spare CAM array 200-1 or 200-2, the replaced search line pair (e.g., SLn and /SLn) have a logic low state but other search line pairs SL1 to /SLn-1 have a same logic state as the asserted search data.

Figure 7:
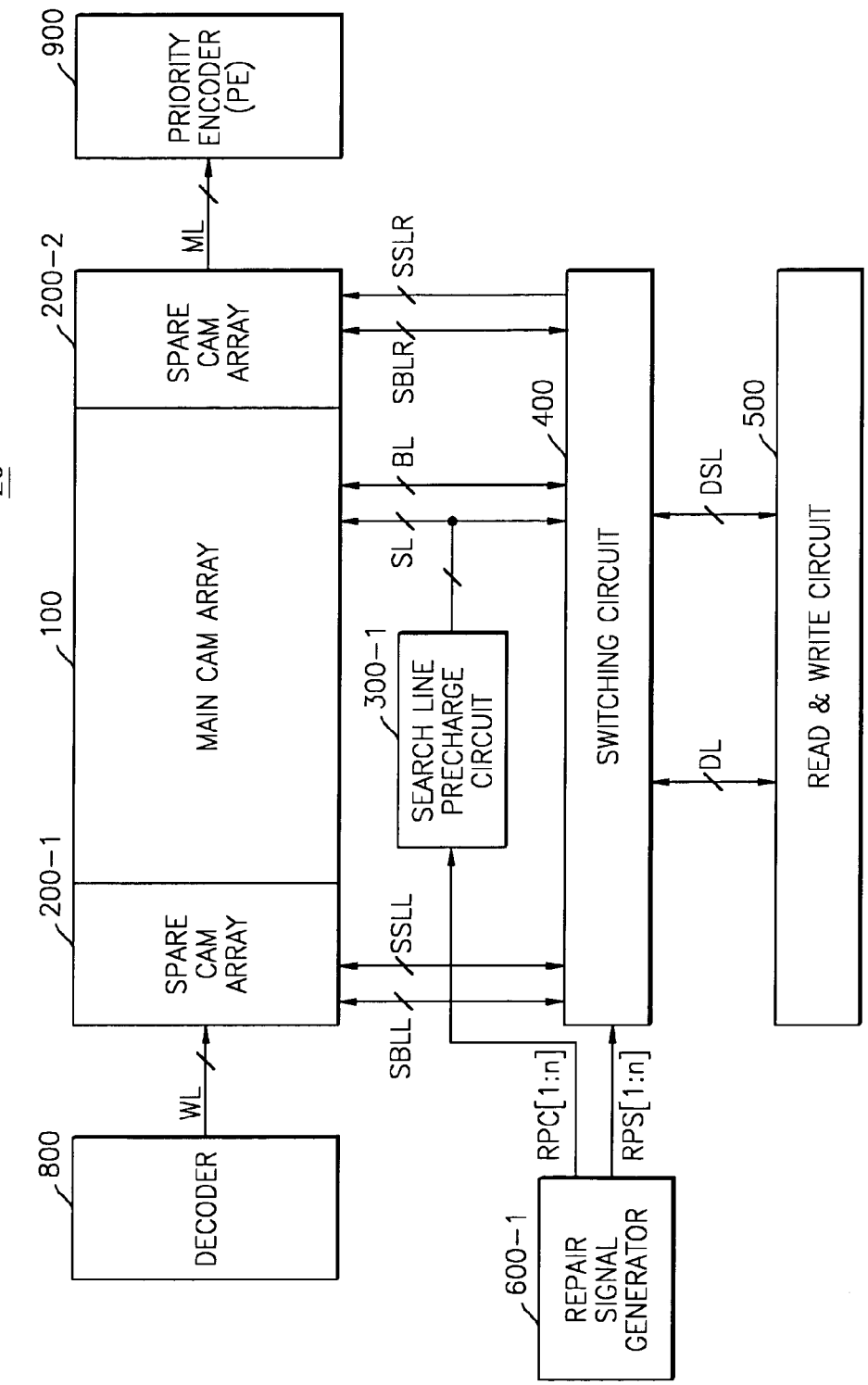
FIG. 7 is a block diagram of a CAM device according to still another embodiment of the present invention.
Figure 8:
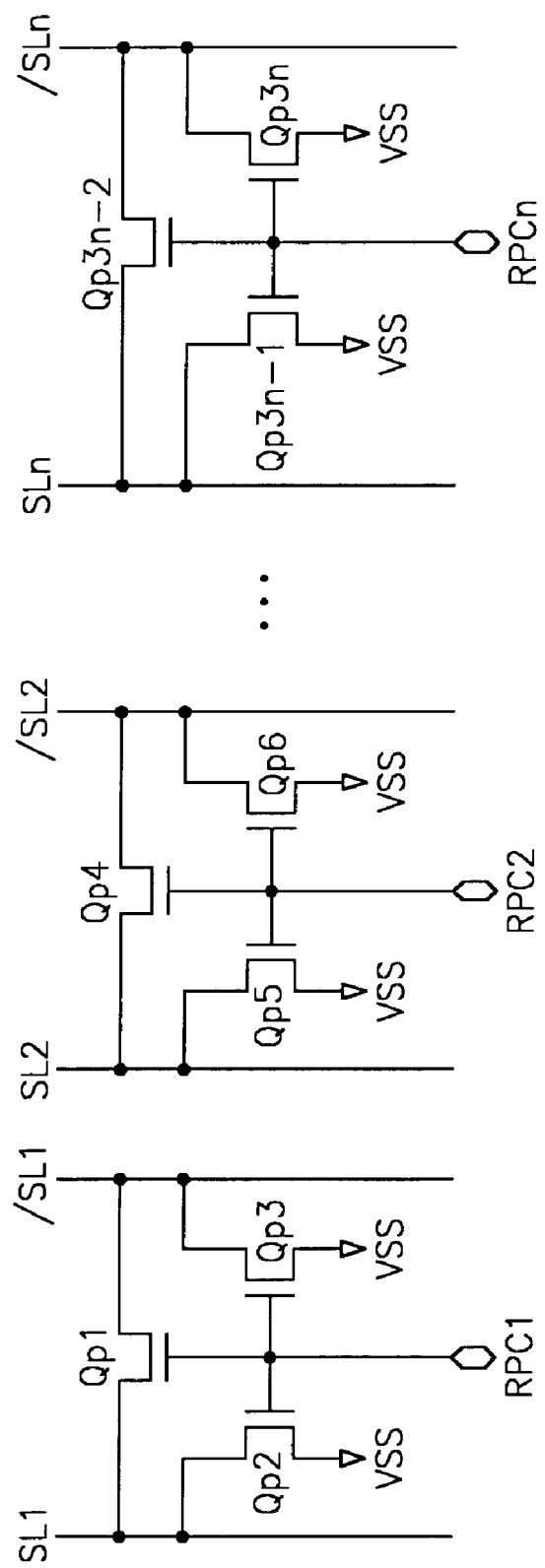
FIG. 8 is a circuit diagram of the search line pre-charge circuit of FIG. 7.

FIG. 7 shows a block diagram of a CAM 20 in accordance with another embodiment of the present invention. The CAM 20 of FIG. 7 is configured the same as the CAM 10 of FIG. 3 except there are differences in a search line pre-charge circuit 300-1 and a repair signal generator 600-1. FIG. 8 shows a detail diagram of search line pre-charge circuit 300-1. This circuit is explained using the first transistor group for SL1 and /SL1. Transistor Qp1 receives at its gate a repair control signal RPC1 from the repair signal generator 600-1, its drain is connected to search line SL1 and its source is connected to search line /SL1. Transistors Qp2 and Qp3 receive at their gates the repair control signal RPC1. The drain of Qp1 is connected to search line SL1 and its source connected to ground. The drain of Qp2 is connected to search line /SL1 and its source connected to ground. Assume that MCn2 in a main CAM array 200 of FIG. 4 has been determined to be defective. In response, repair signal generator 600-1 provides the repair control signals RPC[1:n] to the search line pre-charge circuit 300-1. In this case, the repair control signal RPCn has a logic high state and the other repair control signals RPC1 to RPCn-1 have a logic low state. With RPCn at high, transistors Qp3n–2, Qp3n–1, and Qp3n are turned on and the search line pair SLn, /SLn goes to ground.

Figure 9:
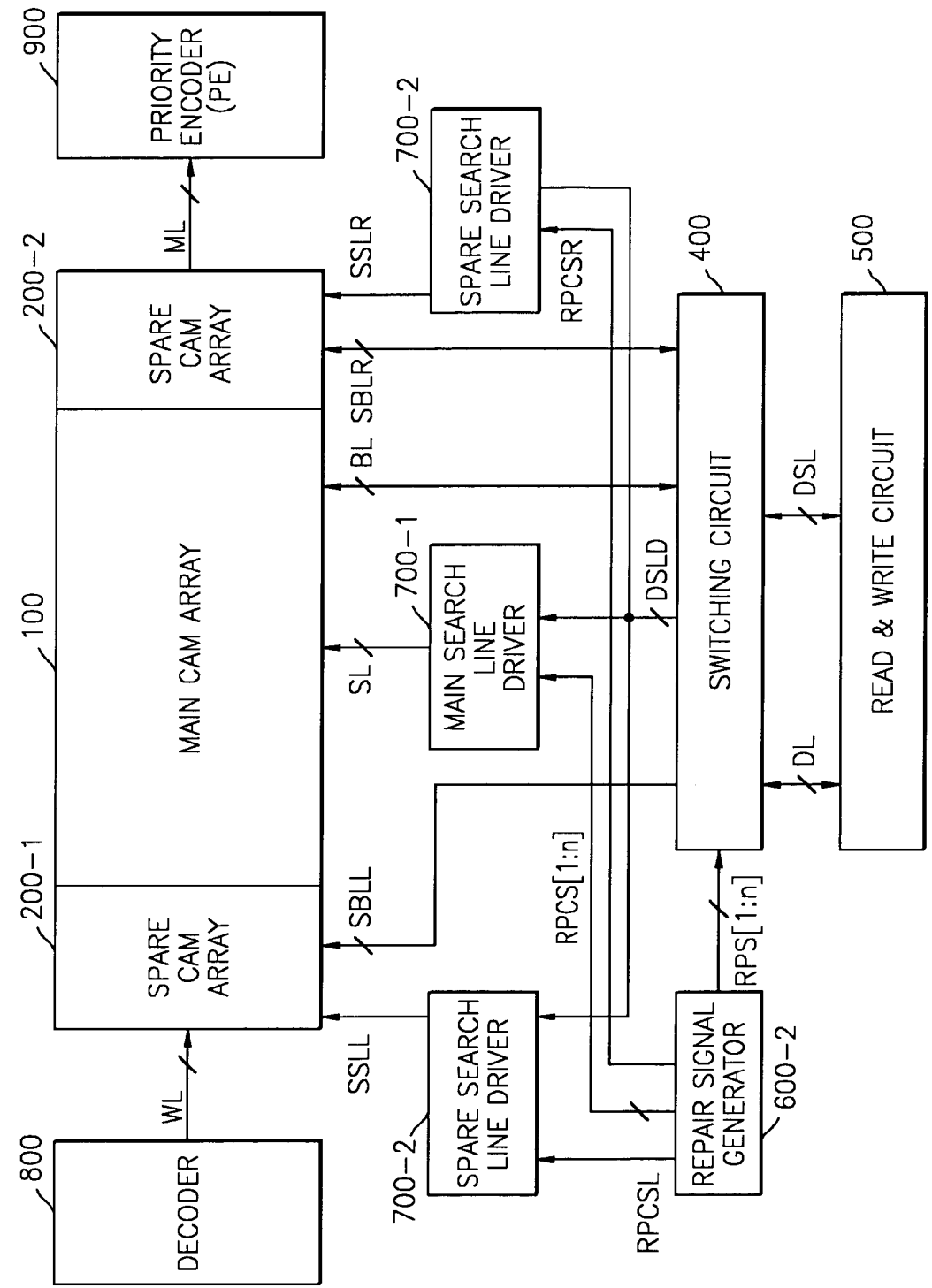
FIG. 9 is a block diagram of another CAM device in accordance with the present invention.

FIG. 9 shows a block diagram of a CAM 30 in accordance with still another embodiment of the present invention. The CAM 30 of FIG. 9 includes the main CAM array 100, a spare CAM arrays 200-1 and 200-2, a main search line driver 700-1, spare search line drivers 700-2, a switching circuit 400, a read & write circuit 500, a repair signal generator 600-2, a decoder 800 and a priority encoder 900.

Figure 10A:
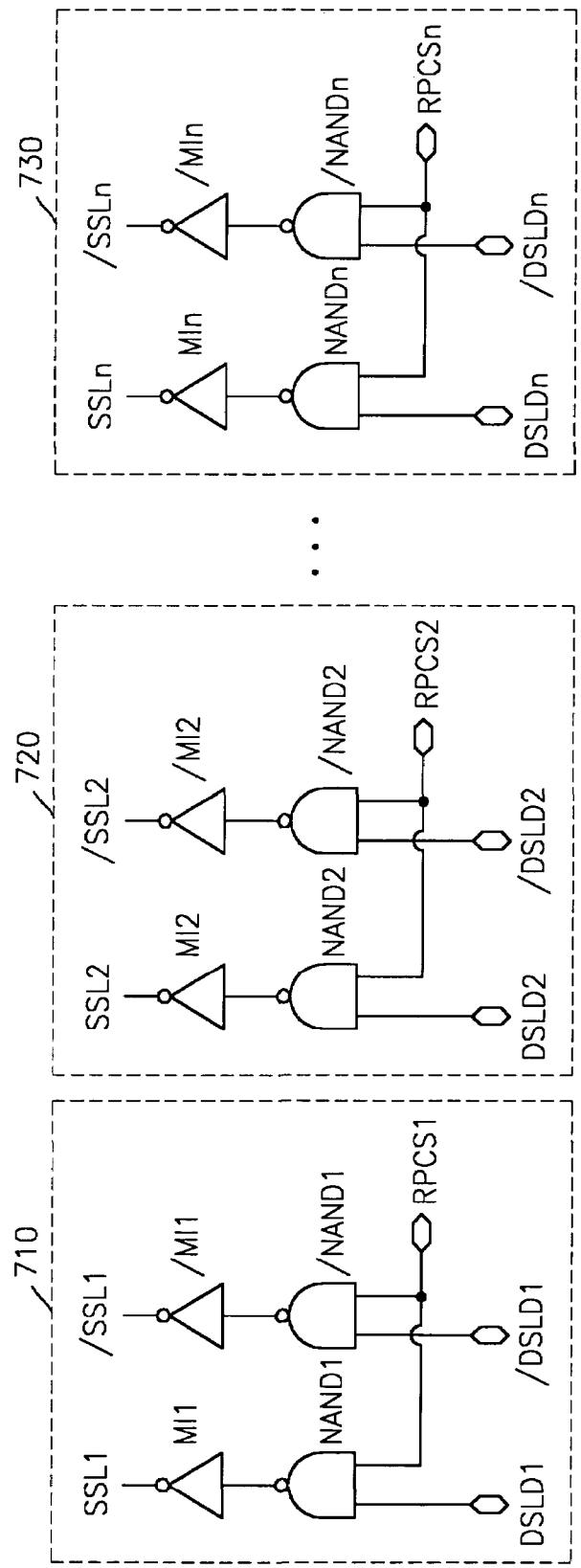
FIG. 10A is a circuit diagram of the main search line driver of FIG. 9.

FIG. 10A shows the circuit diagram of the main search line driver 700-1. Referring to FIG. 10A, the main search line driver 700-1 comprises a plurality of inverters and a plurality of NAND gates.

Figure 10B:
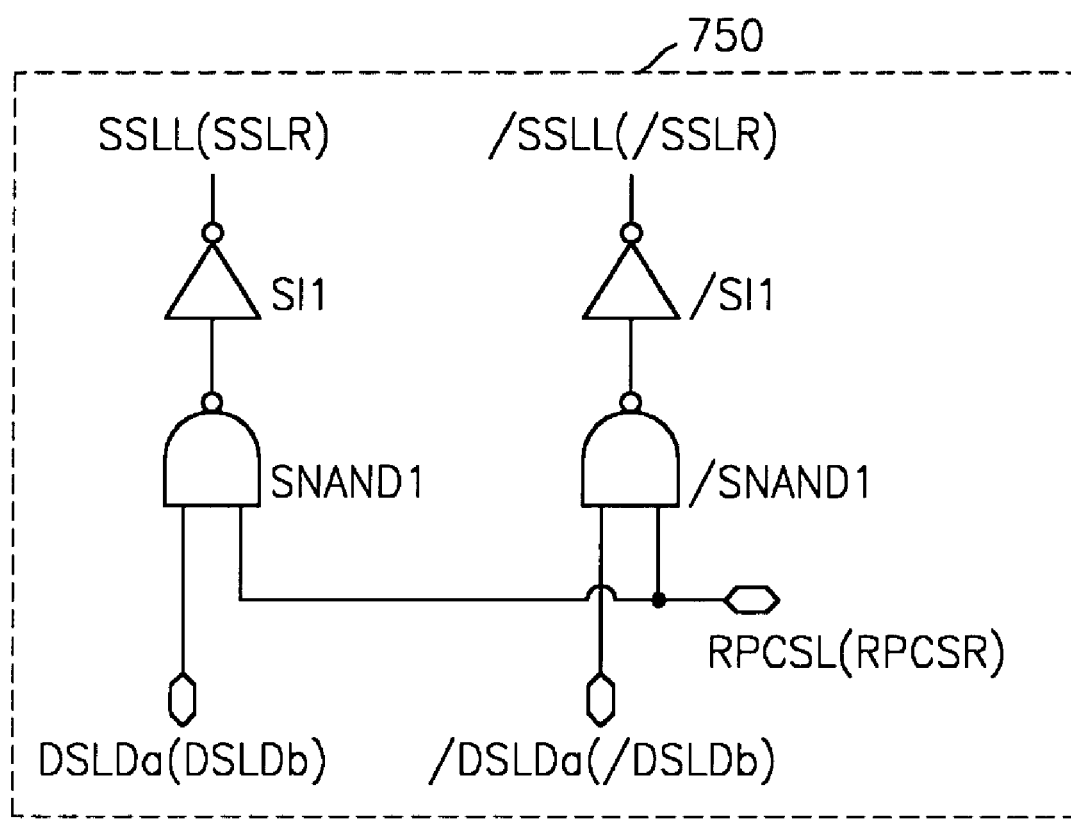
FIG. 10B is a circuit diagram of the spare search line driver of FIG. 9.

FIG. 10B shows the circuit diagram of the spare search line driver 700-2. Referring to FIG. 10B, the spare search line driver 700-2 comprises a plurality of inverters and a plurality of NAND gates.

Referring to FIGS. 9, 10A and 10B, the main CAM array 100 has a plurality of main CAM cells. Spare CAM arrays 200-1 and 200-2 have a plurality of spare CAM cells. The main search line driver 700-1 outputs main search line drive signals SL1 to /SLn in response to repair control signals RPCS1 to RPCSn and search data drive signals DSLD1 to DSLDn (FIG. 10A). The spare search line drivers 700-2 outputs spare search line drive signals SSLL to /SSLR in response to repair control signals RPCSL, RPCSR and search data drive signals DSLD (FIG. 10B). The switching circuit 400 receives repair signals RPS[1:n] from the repair signal generator 600-2 and changes the path of the corresponding bit line pairs and search line pairs to replace a defective memory cell with a spare memory cell. The read & write circuit 500 includes sense amplifiers and data input buffers and data output buffers, etc. (not shown). The repair signal generator 600-2 includes fuses, which may be an electrical or laser programmable types, to store repair information. The repair signal generator 600-2 outputs repair signals RPS[1:n] to the switching circuit 400, outputs repair control signals RPCS1 to RPCSn to the main search line driver 700-1, and outputs repair control signals RPCSL to RPCSR to the spare search line driver 700-2. The decoder 800 selectively drives the word lines WL based on an operation mode instruction from a memory controller (not shown), for example, the decoder 800 selectively drives one of the word lines WL when storing data information in TCAM cells of any row or reading out data information therefrom. The priority encoder 900 generates an address corresponding to currently inputted search data in response to logic states of the match lines ML.

An example is used to illustrate the operation of FIG. 9 to replace a defective column in the main CAM array 100 with a spare column in the spare CAM array 200-1, 200-2. Assume that MCn2 in a main CAM array 100 of FIG. 9 has been determined to be defective. In response, the repair signal generator 600-2 provides RPS[1:n] signals to the switching circuit 400. In this case, a repair signal RPSn has a logic low state and repair signals RPS1 to RPSn–1 have a logic high state in FIG. 6. As shown in FIG. 6, transistors Qsa1 to Qsan–1 and Qsbn are turned on and transistors Qsb1 to Qsbn–1 and Qsan are turned off. Referring to FIG. 10A, with RPCSn at logic low state, SLn and /SLn are forced to logic low by NAND gates and inverters in 730. Thus, the search line pair (e.g., SLn and /SLn) have a logic low state but other search line pairs SL1 to /SLn–1 have a same logic state as the asserted search data. In FIG. 10B, the repair signal generator 600-2 provides repair control signals RPCSL in a logic low state for the corresponding defective cell to switch redundant cell to the bit line and data connections of the defective cell. FIG. 10B shows corresponding search line drive signals SSLL and /SSLL going to a logic low state in response to a logic low RPCSL.

While this invention has been particularly shown and described with reference to preferred embodiments thereof, it will be understood by those skilled in the art that various changes in form and details may be made therein without departing from the spirit and scope of the invention as defined by the appended claims.

What is claimed is:

1. A ternary content addressable memory (TCAM) device comprising:

A plurality of TCAM cells for storing data, each TCAM cell having two memory cells and a comparison circuit for comparing data stored in the memory cells with data input on a search line pair connected to the comparison circuit, wherein the comparison circuit comprises first, second, third, and forth NMOS transistors, the first and second NMOS transistors having their drains connected to a match line, their gates connected to the memory cells and their source connected to drains of the third and forth NMOS transistors, and the third and forth NMOS transistors having their gates connected to the search line pair and their source connected directly to ground, further including a precharge circuit connected directly to the search line pair for discharging each line of the search line pair to ground upon indication that at least one of the memory cells connected thereto are defective.

2. The TCAM device according to claim 1, wherein the comparison circuit discharges the match line upon a mismatch between data stored in the memory cells and data input on the search line pair connected to the comparison circuit.

3. The TCAM device according to claim 1, wherein the precharge circuit comprises two NMOS transistors, each having its gate connected to a power supply node, its source connected to ground and its drain connected to a corresponding one of the search line pair.

4. The TCAM device according to claim 3, wherein the two NMOS transistors of the precharge circuit are sized to present a low level at the search line pair when no signal is present at the search line pair and to present the same level as a signal asserted at the search line pair.

5. The TCAM device according to claim 1, further including a repair signal generator for generating signals indicating which of the memory cells are defective.

6. A ternary content addressable memory (TCAM) device comprising:

A plurality of TCAM cells for storing data, each TCAM cell having two memory cells and a comparison circuit for comparing data stored in the memory cells with data input on a search line pair connected to the comparison circuit, wherein the comparison circuit comprises first, second, third, and forth NMOS transistors, the first and second NMOS transistors having their drains connected to a match line, their gates connected to the memory cells and their source connected to drains of the third and forth NMOS transistors, and the third and forth NMOS transistors having their gates connected to the search line pair and their source connected to ground, further including redundant TCAM cells and a switching circuit for switching at least a plurality of connections of TCAM cells determined to be defective to corresponding connections of the redundant TCAM cells.

7. The TCAM device according to claim 6, wherein the redundant TCAM cells form at least one column of TCAM cells.

8. The TCAM device according to claim 6, wherein the switching circuit outputs signals for switching connections of a column of TCAM cells having defective cells with corresponding connections of a column of redundant TCAM cells.

9. The TCAM device according to claim 6, wherein the memory cells are SRAM cells.

10. The TCAM device according to claim 6, wherein the memory cells are DRAM cells.

11. A ternary content addressable memory (TCAM) device comprising:
A plurality of TCAM cells for storing data, each TCAM cell having two memory cells and a comparison circuit for comparing between data stored in the memory cells and data input on a search line pair connected to the comparison circuit, wherein the comparison circuit comprises a first plurality of MOS transistors connected between a match line and a second plurality of MOS transistors, the second plurality of MOS transistors being connected to ground, wherein the first plurality of MOS transistors are gated by signals from the memory cells connected thereto and the second plurality of transistors are gated by signals from a search line pair, further including a main search line driver for driving data signals to a plurality of search line pairs and at least one redundant search line driver for replacing the main search line driver upon determination that at least one of the memory cells connected to a corresponding search line pair is defective.

12. The TCAM device according to claim 11, wherein the first and second plurality of MOS transistors are N type and are configured to connect the match line to ground upon a mismatch of the data in the corresponding memory cells with the data present at the corresponding search line pair.

13. The TCAM device according to claim 11, further including a repair signal generator for generating signals indicating which of the memory cells are defective.

14. A ternary content addressable memory (TCAM) device comprising:
A plurality of TCAM cells for storing data, each TCAM cell having two memory cells and a comparison circuit for comparing between data stored in the memory cells and data input on a search line pair connected to the comparison circuit, wherein the comparison circuit comprises a first plurality of MOS transistors connected between a match line and a second plurality of MOS transistors, the second plurality of MOS transistors being connected to ground, wherein the first plurality of MOS transistors are gated by signals from the memory cells connected thereto and the second plurality of transistors are gated by signals from a search line pair, further including redundant TCAM cells and a switching circuit for switching at least a plurality of connections of TCAM cells determined to be defective to the redundant TCAM cells.

15. The TCAM device according to claim 14, wherein the switching circuit outputs signals for switching connections of a column of TCAM cells having defective cells with corresponding connections of a column of redundant TCAM cells.

16. The TCAM device according to claim 11, further including a precharge circuit connected to the search line pair for discharging each line of the search line pair to ground upon determination that at least one of the memory cells connected thereto are defective.

17. The TCAM device according to claim 11, further including a memory controller for outputting control signals for controlling operations of the TCAM.

18. The TCAM device according to claim 11, wherein the memory cells are SRAM cells.

19. The TCAM device according to claim 11, wherein the many cells are DRAM cells.

20. A method of operating a ternary content addressable memory (TCAM) device comprising:
comparing data stored in memory cells of the TCAM with data input on a search line pair connected to a comparison circuit, wherein the comparison circuit comprises a first plurality of MOS transistors connected between a match line and a second plurality of MOS transistors, the second plurality of MOS transistors being connected to ground, wherein the first plurality of MOS transistors are gated by signals from the memory cells connected thereto and the second plurality of transistors are gated by signals from a search line pair, further including switching at least a plurality of connections of TCAM cells determined to be defective to redundant TCAM cells.

21. The method according to claim 20, further including switching at least a plurality of connections of TCAM cells determined to be defective to redundant TCAM cells.

22. The method according to claim 20, further including discharging to ground each line of the search line pair upon determination that memory cells connected thereto are defective.

23. The TCAM device according to claim 1, wherein the memory cells are SRAM cells.

24. The TCAM device according to claim 1, wherein the memory cells are DRAM cells.

25. The TCAM device according to claim 11, wherein the memory cells are SRAM cells.

26. The TCAM device according to claim 11, wherein the memory cells are DRAM cells.

27. The TCAM device according to claim 14, wherein the memory cells are SRAM cells.

28. The TCAM device according to claim 14, wherein the memory cells are DRAM cells.

29. The TCAM device according to claim 20, wherein the memory cells are SRAM cells.

30. The TCAM device according to claim 20, wherein the memory cells are DRAM cells.

* * * * *